United States Patent
Piazza et al.

(10) Patent No.: US 10,770,642 B2
(45) Date of Patent: Sep. 8, 2020

(54) TWO-DIMENSIONAL MODE RESONATORS

(71) Applicant: CARNEGIE MELLON UNIVERSITY, Pittsburgh, PA (US)

(72) Inventors: Gianluca Piazza, Pittsburgh, PA (US); Cristian Cassella, Boston, MA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 213 days.

(21) Appl. No.: 15/560,757

(22) PCT Filed: Mar. 24, 2016

(86) PCT No.: PCT/US2016/023941
§ 371 (c)(1),
(2) Date: Sep. 22, 2017

(87) PCT Pub. No.: WO2016/154397
PCT Pub. Date: Sep. 29, 2016

(65) Prior Publication Data
US 2018/0083181 A1  Mar. 22, 2018

Related U.S. Application Data

(60) Provisional application No. 62/177,809, filed on Mar. 24, 2015.

(51) Int. Cl.
| | |
|---|---|
| *H01L 41/09* | (2006.01) |
| *H04R 17/10* | (2006.01) |
| *H03H 3/02* | (2006.01) |
| *H03H 3/04* | (2006.01) |
| *H03H 9/02* | (2006.01) |
| *H01L 41/18* | (2006.01) |
| *H03H 9/125* | (2006.01) |
| *H03H 9/15* | (2006.01) |

(52) U.S. Cl.
CPC ............ *H01L 41/09* (2013.01); *H01L 41/183* (2013.01); *H03H 3/02* (2013.01); *H03H 3/04* (2013.01); *H03H 9/02228* (2013.01); *H03H 9/02259* (2013.01); *H03H 9/125* (2013.01); *H04R 17/10* (2013.01); *H03H 2009/02283* (2013.01); *H03H 2009/155* (2013.01)

(58) Field of Classification Search
CPC combination set(s) only.
See application file for complete search history.

(56) References Cited

U.S. PATENT DOCUMENTS

| | | |
|---|---|---|
| 7,388,318 B2 | 6/2008 | Yamada et al. |
| 7,888,843 B2 | 2/2011 | Ayazi et al. |

(Continued)

FOREIGN PATENT DOCUMENTS

| | | |
|---|---|---|
| WO | 2014112951 A1 | 7/2014 |
| WO | 2015012914 A2 | 1/2015 |

OTHER PUBLICATIONS

International Search Report and Written Opinion of the International Searching Authority for PCT/US2016/023941 dated Jun. 16, 2016.

(Continued)

*Primary Examiner* — Bryan P Gordon

(57) ABSTRACT

A piezoelectric two-dimensional mode resonator suited for high frequency filtering applications, with the ability to simultaneously excite lateral and vertical acoustic waves.

15 Claims, 5 Drawing Sheets

(56) References Cited

U.S. PATENT DOCUMENTS

| | | | |
|---|---|---|---|
| 7,898,158 B1 | 3/2011 | Li et al. | |
| 2011/0148252 A1* | 6/2011 | Li | H03H 9/02275 |
| | | | 310/321 |
| 2012/0314007 A1* | 12/2012 | Shimofuku | B41J 2/14201 |
| | | | 347/71 |
| 2013/0021305 A1 | 1/2013 | Zuo et al. | |
| 2013/0300521 A1* | 11/2013 | Khine | H03H 9/54 |
| | | | 333/187 |
| 2014/0111064 A1 | 4/2014 | Zuo et al. | |
| 2016/0182007 A1* | 6/2016 | Bhattacharjee | H03H 3/02 |
| | | | 310/313 D |

OTHER PUBLICATIONS

International Preliminary Report on Patentability for PCT/US2016/023941 dated Oct. 5, 2017.

* cited by examiner

TWO-DIMENSIONAL MODE RESONATORS

RELATED APPLICATIONS

This application is a national phase filing claiming the benefit of and priority to International Patent Application No. PCT/US2016/023941, entitled "TWO-DIMENSIONAL MODE RESONATORS," filed Mar. 24, 2016, which claims the benefit of U.S. Provisional Patent Application Ser. No. 62/177,809, filed Mar. 24, 2015, which are hereby incorporated by reference in their entireties.

FIELD OF THE INVENTION

This invention related to high frequency filtering and oscillators and, in particular, to the use of two-dimensional mode resonators to perform filtering and serve as a frequency reference.

BACKGROUND OF THE INVENTION

The development of fully integrated radio-frequency front-ends used in cell phones, radios, and other devices, requires the adoption of high performance filtering systems that could be integrated on the same chip as antenna switches and power amplifiers.

Micro-Electro Mechanical (MEM) resonators and filters represent promising candidates for replacing Surface Acoustic Wave (SAW) devices in future transmitter and receiver modules. Unlike SAW-based devices, MEM resonators and filters can be built using CMOS-compatible fabrication processes, thereby enabling integrated RF front-ends. However, to make migration to MEM-based devices feasible, it is necessary to improve the performance attained by MEM resonators and filters so as they are on par with SAW-based devices.

Aluminum nitride (AlN) based piezoelectric MEM resonators have been largely researched for their ability to achieve moderate quality factor (Qs) and high electromechanical coupling coefficient ($k_t^2$) throughout the entire microwave spectrum. In particular two main types of AlN based resonators have been already demonstrated: Film Bulk Acoustic Resonators (FBARs) and contour mode resonators (CMRs). FBARs use the AlN $d_{33}$ piezoelectric coefficient to excite longitudinal vibrations along the thickness of AlN plates. In contrast, CMRs can excite lateral vibrations along one of the in-plane dimensions of AlN plates through the AlN $d_{31}$ piezoelectric coefficient. As the electromechanical coupling of a MEM resonator is proportional to the magnitude of the adopted piezoelectric coefficient, FBARs show larger $k_t^2$ than CMRs. In contrast, CMRs enable multiple frequency references on the same chip, without additional fabrication costs.

Although the excitation of combined modes was proposed as a way to increase $k_t^2$ in AlN piezoelectric resonators, previous work showed only small improvements with respect to that attained by CMRs. In addition, devices demonstrated in previous work cannot attain a large capacitance per unit area, thereby complicating its impedance matching to a 50-ohm load.

SUMMARY OF THE INVENTION

Presented herein is a novel device topology implementation of a two dimensional mode resonator (2DMR) which displaces, at resonance, along both lateral and thickness directions. The invention enables a $k_t^2$ higher than 4.5% in an AlN resonator. In addition, as opposed to FBARs, this resonator enables moderate lithographic tunability of the resonator frequency without requiring higher fabrication costs. This allows the invention to be used in wideband filtering applications in the microwave frequency range.

This invention has been demonstrated operating in the 0.7 to 3.5 GHz range, with a $k_t^2$ larger than 4.5%, a mechanical quality factor higher than 2000 and a figure of merit around 100. In addition, a greater than 10% lithographic variation of the resonance frequency was attained without significant performance degradation. Lastly, this invention has demonstrated excellent power handling (>9 dBm) in a 50 ohm-matched resonator.

DETAILED DESCRIPTION OF THE INVENTION

The following description is based upon lab-tested implementations of the device. As would be realized by one of skill in the art, various modifications may be made to materials, dimensions, and other fabrication variables without departing from the invention.

A version of the novel two-dimensional-mode resonator is formed by a layer of piezoelectric material sandwiched between two identical metallic gratings, which are used to apply the electric field across the thickness of the piezoelectric film. In the preferred embodiment, aluminum nitride (AlN) is used as the piezoelectric film, however, any material exhibiting piezoelectric properties may be used, for example, gallium nitride (GaN), gallium arsenide (GaAs), Lithium niobate (LiNbO$_3$), lead zirconate titanate (PZT) and PMNT. Also in the preferred embodiment, the strips or fingers of the metallic gratings are preferably composed of platinum or molybdenum, but other materials are also suitable, for example, gold, copper and ruthenium.

Figure 1:
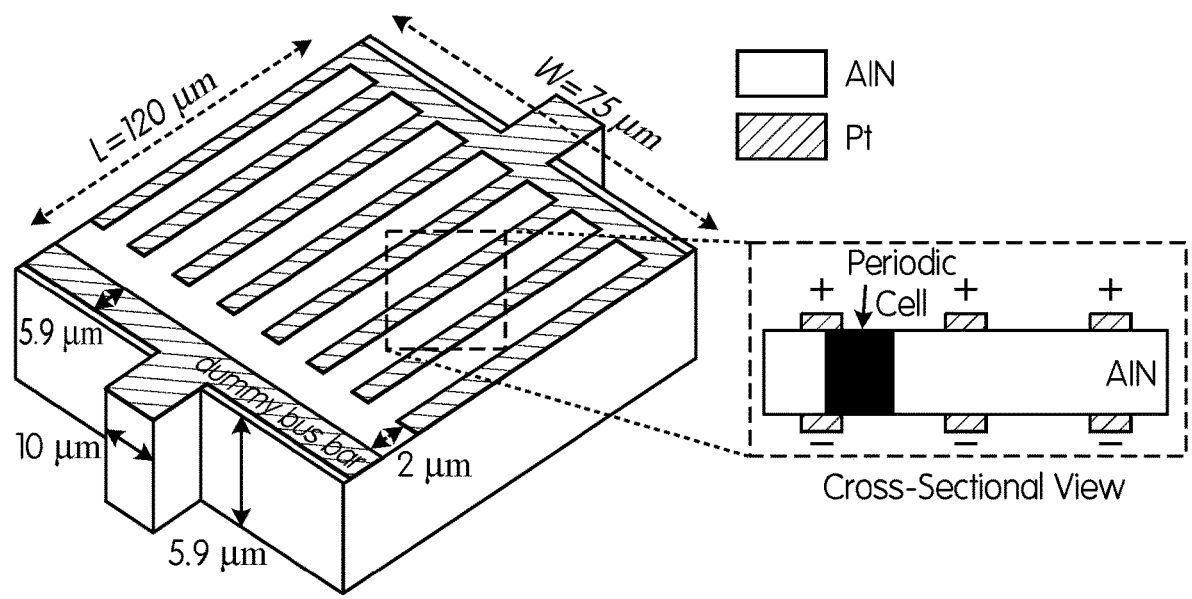
FIG. 1 shows a schematic representation of the 2DMR, noting dimensions of the lab-tested version.

An exemplar of the device, shown in FIG. 1, was fabricated using a 5.9 μm thick AlN layer with gratings formed by a set of 8 equipotential 120 nm thick platinum strips or fingers. The resonance frequency of 2DMRs is mostly determined by the thickness of AlN ($T_{AlN}$) and by the pitch ("W", i.e., the spacing between the strips) of both gratings (s). Thus, the mode excited by two-dimensional-mode resonators is a combination of both lateral and longitudinal vibrations of the piezoelectric material. Generally, when using platinum to form the metal gratings, $T_{AlN}$ should be approximately 2.2 W to 2.6 W to set up the 2D mode of vibration. However, variations of up to 30% will work when using different metals.

Although the lateral and longitudinal motions generally occur at different frequencies, there exists an s-value ($s_{min}$) above which they are coupled into a unique mode of vibration. $s_{min}$ is inversely proportional to the width of the metal strips ($W_e$). Therefore, s was chosen, so that a spurious-less electrical response could be attained when using a minimum $W_e$ size (1 μm). In addition, as the device acoustic symmetry is key for the proper excitation of this new class of resonators, "dummy" metallic bus bars were placed that also cover the anchor as shown in FIG. 1.

Figure 2:
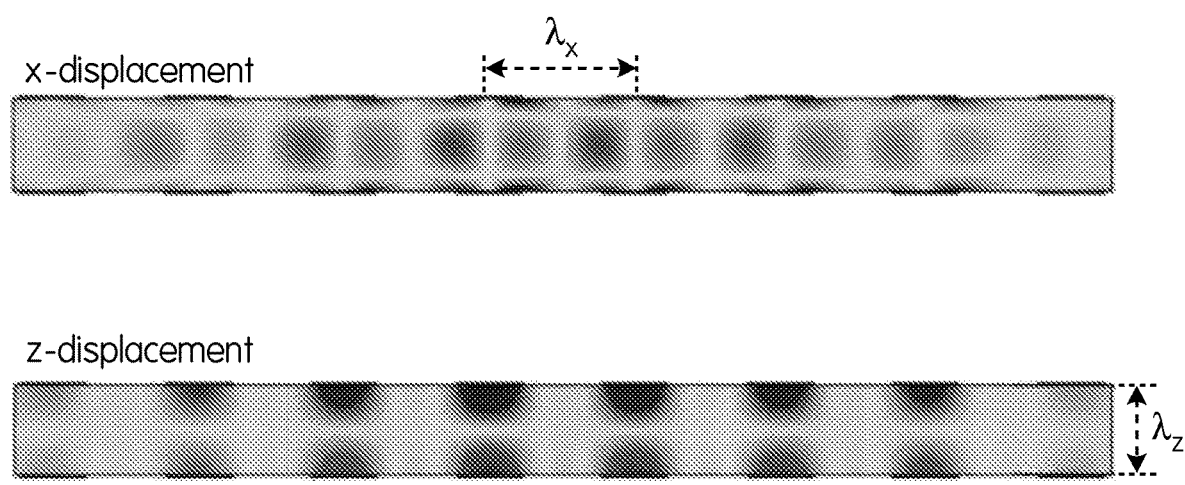
FIG. 2 shows the spatial distribution of lateral and longitudinal displacement across the piezoelectric film in the 2DMR, along with the wavelengths $\lambda_x$ and $\lambda_z$, which are set respectively by the electrode pitch and the thickness of the piezoelectric layer.

The present invention is able to generate two different wavelengths, shown in FIG. 2 and denoted by $\lambda_x$ and $\lambda_z$ which are set by the pitch of the electrode and the thickness of the piezoelectric layer. The resonance frequency is therefore a combination of both $\lambda_x$ and $\lambda_z$.

The displacement along both the x- and z-directions shows close to orthogonal displacement components at the interface between the platinum electrodes and the AlN film. This property enables the existence of the excited combined mode and allows for the maximization of the amount of piezo charge produced by the resonator. As the z-displacement is in phase with the strain in the x-direction, the charge produced through the $d_{33}$ coefficient sums with the charge produced through the $d_{31}$. This property is utilized in this invention to attain high $k_t^2$.

Due to a large dependence of both the stiffness and the effective mass of the lateral mode on $W_e$, the resonant frequency changes inversely with respect to the width of the metal strips $W_e$.

To validate the operation of the invention, multiple different configurations were fabricated with varied electrode width between 1 and 5 μm. The device fabrication used a 4-mask process flow. A 120 nm thick platinum layer was initially patterned to form the bottom metallic grating, followed by a 5.9 μm thick AlN film, followed by the deposition of a 2 μm thick $SiO_2$ layer. This layer is used as hard mask for the AlN etch during the vias formation. In order to etch the $SiO_2$ a bilayer mask was used, formed by 100 nm of Cr and 10 μm of photoresist. This choice permitted to reduce the sidewall angle of the $SiO_2$ with respect to the use of solely photoresist. After etching the $SiO_2$ the AN was etched to form the vias that are needed to provide electrical connection to the bottom metal grating. The AlN etch was followed by wet-etch of the remaining $SiO_2$ through buffer HF. After vias are formed, a second 120 nm thick platinum layer is patterned to form the top metallic gratings. This step is followed by a second AlN etch that is now used to define the size of the plate and provide access to the silicon substrate. The device is then released from the substrate by a dry etch in $XeF_2$.

The capacitance of the 2DMRs ($C_0$) was significantly increased by the presence of two sources of parasitics: the pad capacitance ($C_{pad}$) and the fringing capacitance between the electrodes and the closest dummy bus bar ($C_{bus}$) that is connected to the opposite polarity. These two capacitance values were subtracted to extract the actual device $k_t^2$. The impact of these parasitic capacitances can be mitigated by properly sizing the number of electrodes forming the gratings or placing multiple resonators in parallel so that $C_0$ is much larger than $C_{pad}$. The impact of $C_{bus}$ can be further reduced by increasing the separation between the bus and the grating.

The 2DMRs disclosed as the first embodiment herein demonstrated a mechanical quality factor ($Q_m$) close to 2400, which corresponds to a motional resistance ($R_m$) close to 35 Ohms. After de-embedding $C_{pad}$ and $C_{bus}$ a maximum $k_t^2$ of 5% was found. In this formulation the measured figure of merit is largely degraded by $C_{bus}$ and the electrode resistance. However, such degradation could be mitigated by increasing the separation between the dummy bus bar and the adjacent grating (as pictured in FIG. 1), as well as by using a larger number of shorter periodic cells.

The frequency variation greater than 10% was attained by lithographically varying the geometry of the metal gratings. This and the fact that due to the thick AlN layer the implemented devices showed extremely high power handling, the invention looks to be very valuable for UHF wideband filtering application.

Figure 3:
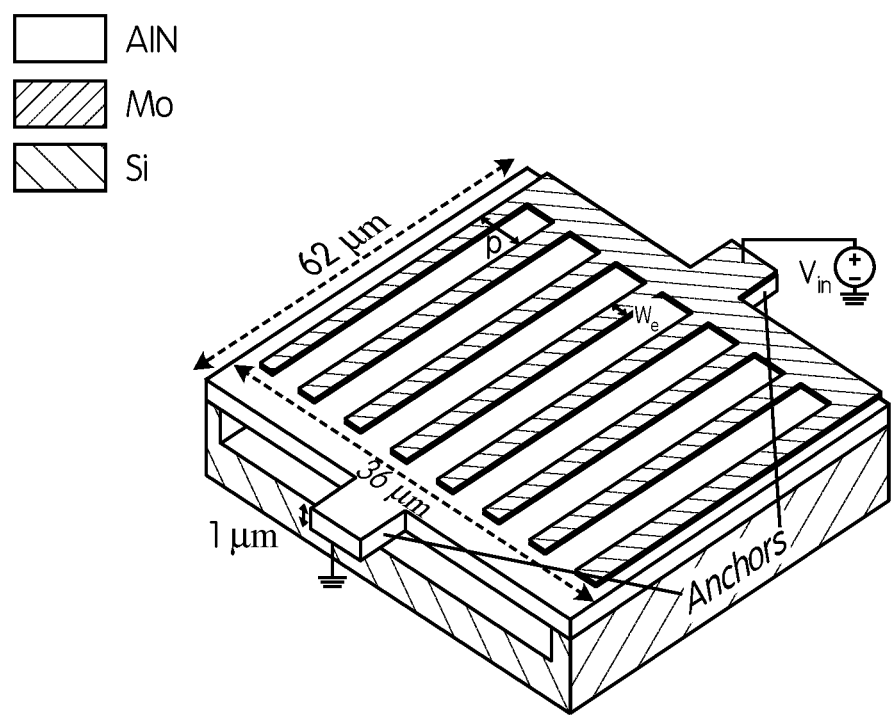
FIG. 3 shows a second embodiment of the invention

A second embodiment of the invention is shown in FIG. 3. The 2DMR of this second embodiment is formed by a 1-μm thick AlN layer sandwiched between two identical metallic gratings, electrically connected through the use of two suspended anchors. The gratings are formed by a set of equipotential molybdenum (Mo) strips that are used to apply the electric field in the AlN film, as shown in FIG. 3. In this embodiment of the invention, the strips are approximately 150 nm thick, however, the strips may be anywhere in the range of approximately 10 nm to 200 nm in thickness, with a maximum size of about 1 μm before the device become impractical to build. In this implementation there are 8 metallic strips forming the gratings, however, the number of metallic strips can be arbitrarily modified, without degrading the device $k_t^2$, to define the resonator input impedance. In addition, the 2DMRs of this embodiment do not require a lateral etch of the AlN film. This fact works to suppress any spurious-mode caused by the AlN lateral sidewall profile. In addition, as these 2DMRs can be fully-anchored at both their lateral-sides, they enable higher-power handling than suspended-resonators, such as AlN CMRs.

As with the first embodiment, the 2DMRs of the second embodiment excite a two-dimensional mode of vibration characterized by similar peak-to-peak displacement values along both the thickness ($T_{AlN}$) and the width ($W_{AlN}$) of an AlN-plate (FIG. 3). Consequently, their resonance frequency ($f_{res}$) depends on both these two geometrical parameters, although it has first order dependence on thickness and a $2^{nd}$ order dependence on the lateral dimensions.

Figure 4:
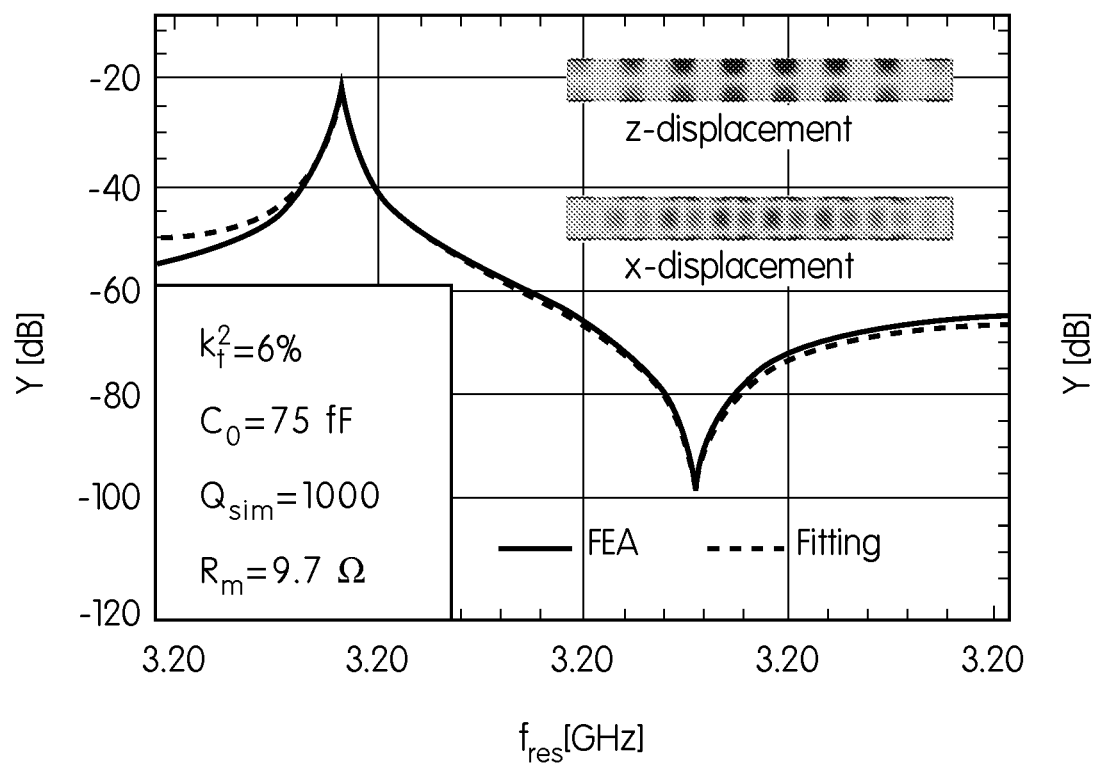
FIG. 4 shows a simulated electrical response of the device.

The electrical performance of the device was evaluated through 2D-Finite Element Analysis (FEA). Its simulated admittance response ($Y_{sim}$) is reported in FIG. 4. As evident a $k_t^2$ in excess of 6% was simulated. Such a high $k_t^2$ value enabled by the combined use of the AlN $d_{31}$ and $d_{33}$ piezoelectric coefficients. The simulated displacement distributions along both the x- and the z-directions is also reported in FIG. 4.

Figure 5:
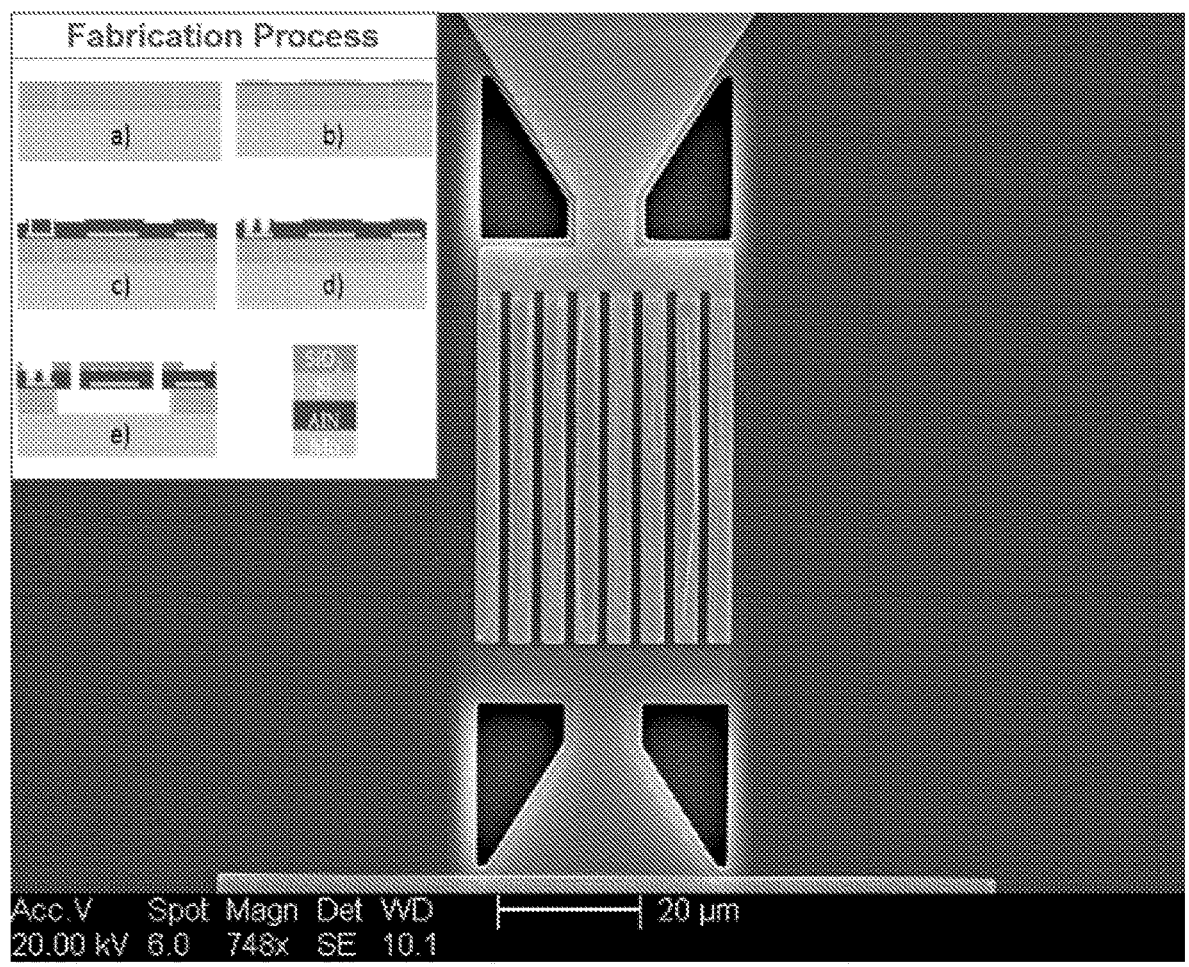
FIG. 5 shows a photograph of an actual fabricated device as well as the steps used to fabricate the device.

The devices presented herein can be fabricated through a sacrificial micromachining processes, using TEOS oxide or silicon as a sacrificial layer and vapor-hydrofluoric-acid (VHF) or xenon difluoride as a structural releasing chemical. Other materials and methods of fabrication may also be possible. The fabrication process included five main steps, as summarized in FIG. 5. First, isolation trenches are created in a deposited 3 μm-thick PECVD TEOS oxide acting as a sacrificial layer. This is followed by the deposition of a polysilicon layer, which then can be polished through CMP (FIG. 5a). Next, a 20 nm-thick AlN seed-layer and 150 nm-thick molybdenum (Mo) layers were patterned on top of the TEOS layer (FIG. 5b). In particular, the molybdenum layer was patterned through a tapered etch-profile so as to achieve better crystalline quality in the subsequent deposition of the 1 μm-thick AlN layer (FIG. 5c). Next, vias are formed in the AlN layer, followed by the deposition of a second 150 nm-thick Molybdenum layer (FIG. 5d). This step is followed by a second AlN-etching step, through TEOS hard-mask, to form the release holes. Finally VHF can be used to etch both the oxide underneath the device and that used as a hard-mask during the AlN etch (FIG. 5e).

Although the invention is illustrated and described herein with reference to specific embodiments, the invention is not intended to be limited to the details shown. Rather, various modifications may be made in the details of the devices and in the fabrication of the devices without departing from the invention. Specifically, different piezoelectric materials may be used in lieu of AlN, and various other metallic materials may be used for the gratings.

We claim:

1. A MEM device forming a two-dimensional mode resonator comprising:
    a piezoelectric layer having a top surface and a bottom surface;
    a first metallic grating disposed on said top surface, said first metallic grating comprising a plurality of electrically-coupled, parallel electrodes extending across said top surface; and
    a second metallic grating disposed on said bottom surface, said second metallic grating comprising a plurality of electrically-coupled, parallel electrodes extending across said bottom surface;
    wherein all parallel electrodes on the top surface are connected together and further wherein all electrodes on the bottom surface are connected together.

2. The device of claim 1 wherein said first metallic grating and said second metallic grating are identical.

3. The device of claim 1 wherein applying a voltage differential between said first metallic grating and said second metallic grating causes both longitudinal and lateral vibrations in said piezoelectric layer.

4. The device of claim 3 wherein said longitudinal vibrations and said lateral vibrations combine into a single mode of vibration.

5. The device of claim 4 wherein the frequency at which said single mode of vibration is formed is dependent upon the width of the electrodes on said first and second metallic gratings.

6. The device of claim 5 wherein said device has a resonant frequency which varies inversely with the width of the electrodes in said first and second metallic gratings.

7. The device of claim 1 wherein said device has a resonance frequency, said resonance frequency having a first order dependency on the thickness of said piezoelectric layer and a second order dependency of the width of the electrodes in the first and second metallic gratings.

8. The device of claim 1 wherein said piezoelectric layer is composed of a material selected from a group consisting of aluminum nitride, gallium nitride, gallium arsenide, lithium niobate, lead zirconate titanate and PMNT.

9. The device of claim 8 wherein said piezoelectric layer has a thickness between approximately 100 nm and 6 µm.

10. The device of claim 1 wherein said first and said second metallic gratings are composed of a material selected from a group consisting of platinum, molybdenum, gold, copper and ruthenium.

11. The device of claim 1 wherein said first and second metallic gratings have a thickness less than 1 µm.

12. The device of claim 1 wherein said first and said second metallic gratings have a thickness in an approximate range of 10 to 200 nm.

13. The device of claim 1 further comprising a first suspended anchor portion connected to said first metallic grating and a second suspended anchor portion connected to said second metallic grating.

14. The device of claim 1 wherein said first and second metallic gratings are connected to in-phase voltage sources.

15. The device of claim 1 wherein said piezoelectric layer is composed of aluminum nitride, wherein said first and second metallic gratings are composed of platinum and further wherein the thickness of said piezoelectric layer is between 2.2 and 2.6 times the pitch of the electrodes in said first and second metallic gratings.

* * * * *